(12) United States Patent
Tatsumi

(10) Patent No.: US 9,641,136 B2
(45) Date of Patent: May 2, 2017

(54) TRAVELLING WAVE AMPLIFIER (TWA) FOR DRIVING OPTICAL MODULATOR

(71) Applicant: SUMITOMO ELECTRIC INDUSTRIES, LTD., Osaka-shi, Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/837,535

(22) Filed: Aug. 27, 2015

(65) Prior Publication Data

US 2016/0065154 A1 Mar. 3, 2016

(30) Foreign Application Priority Data

Aug. 29, 2014 (JP) ................................. 2014-175528

(51) Int. Cl.
| | |
|---|---|
| H03F 1/18 | (2006.01) |
| H03F 1/48 | (2006.01) |
| H03F 3/183 | (2006.01) |
| H03F 3/45 | (2006.01) |
| H03F 3/60 | (2006.01) |

(52) U.S. Cl.
CPC ............. *H03F 1/486* (2013.01); *H03F 3/183* (2013.01); *H03F 3/45179* (2013.01); *H03F 3/45475* (2013.01); *H03F 3/602* (2013.01); *H03F 3/605* (2013.01); *H03F 2200/165* (2013.01); *H03F 2203/45311* (2013.01); *H03F 2203/45374* (2013.01); *H03F 2203/45394* (2013.01); *H03F 2203/45544* (2013.01); *H03F 2203/45594* (2013.01); *H03F 2203/45596* (2013.01); *H03F 2203/45598* (2013.01)

(58) Field of Classification Search
CPC ........................................................ H03F 1/18
USPC ..................................................... 330/286, 54
See application file for complete search history.

(56) References Cited

U.S. PATENT DOCUMENTS

| | | | | |
|---|---|---|---|---|
| 2,958,046 A | * | 10/1960 | Watters | ..................... H03F 1/18 324/117 R |
| 5,550,513 A | * | 8/1996 | Wong | ..................... H03G 7/001 330/286 |
| 8,704,592 B2 | * | 4/2014 | Tatsumi | .............. H03F 3/45089 330/286 |

FOREIGN PATENT DOCUMENTS

| | | |
|---|---|---|
| JP | H09-130170 A | 5/1997 |
| JP | 2010-272918 A | 12/2010 |

* cited by examiner

*Primary Examiner* — Henry Choe
(74) *Attorney, Agent, or Firm* — Global IP Counselors, LLP

(57) ABSTRACT

A travelling wave amplifier (TWA) with a widened frequency bandwidth is disclosed. The TWA include input transmission lines, amplifier units connected in parallel between the input terminal and the out terminal of the TWA. Each of the amplifier units configures an emitter follower in the front end thereof and an amplifying section. A feature of the TWA is that compensation units that compensates the high frequency performance of the TWA are implemented in the input transmission lines and/or integrated with the amplifier units.

9 Claims, 11 Drawing Sheets

TRAVELLING WAVE AMPLIFIER (TWA) FOR DRIVING OPTICAL MODULATOR

CROSS-REFERENCE TO RELATED APPLICATIONS

This application claims priority under 35 U.S.C. §119(a) to Japanese Patent Application No. 2014-175528, filed in Japan on Aug. 29, 2014, the entire contents of which are hereby incorporated herein by reference.

BACKGROUND OF THE INVENTION

1. Field of the Invention

The present invention relates to a travelling wave amplifier (TWA), in particular, a TWA for driving an optical modulator.

2. Background Arts

Recent optical communication system implements a transmitter optical module having an optical source, typically a semiconductor laser diode (LD), to emit continuous wave (CW) light combined with an optical modulator such as an electro-absorption modulator (EAM) and/or a Mach-Zehnder modulator (MZM) to modulate the CW light. The transmitter optical module is requested to be operable in a speed exceeding 25 Gbps or sometimes reaching 40 Gbps, where rising and falling times shorter than 10 ps as a large signal performance and a good S-parameter as a small signal performance are inevitable for achieving superior transmission performance. Accordingly, the transmitter optical module applicable to such high speed system usually installs a diver for driving the modulator configured with a TWA.

In order to enhance the capacity of the communication system, recent transmitter optical modules may have an arrangement of the multi-level modulation, for instance, 4-levels pulse-amplitude modulation (4-PAM) and/or 16-levels quadrature-amplitude modulation (16-QAM). The multi-level modulation inevitably requires a gain bandwidth substantially flat to a modulation frequency. For instance, a PAM-n algorithm, where n is an integer greater than unity (1), with a speed of 32 Gbps requires the flat gain bandwidth of 30 GHz, and 50 GHz bandwidth for a speed of 56 Gbps.

SUMMARY OF THE INVENTION

An aspect of the present application relates to a TWA that comprises an input terminal, an output terminal, a number of input transmission lines, a number of amplifier units, and a number of output transmission lines. The input terminal receives an input signal. The output terminal externally outputs an output signal. The input transmission lines are connected in series to the input terminal to transmit the input signal. The amplifier units include an emitter follower and an amplifier section. The emitter follower receives the input signal through the input transmission lines. The amplifier section outputs an amplified signal to the output transmission lines as a part of the output signal. The output transmission lines, which are connected in series to the output terminal, transmit the amplified signals output from respective amplifier units. A feature of the TWA of the present invention is that one of the input transmission lines or the amplifier units each provides compensation units that may compensate for a frequency response of the emitter follower to which the compensation unit is connected.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Figure 1:
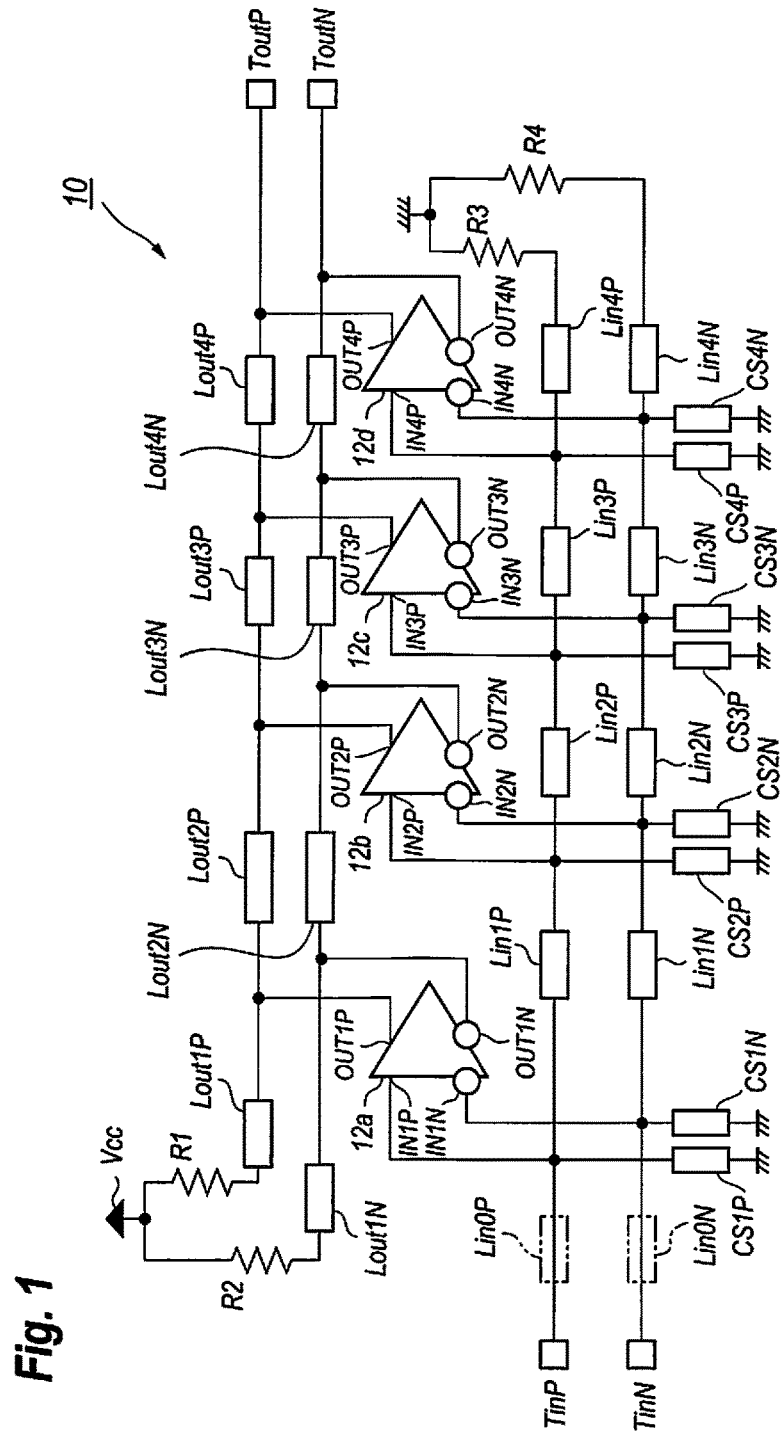
FIG. 1 is a circuit diagram of a travelling amplifier according (TWA) to a first embodiment of the present invention.

FIG. 1 shows a circuit diagram of a travelling wave amplifier (TWA) 10 according to the first embodiment of the present application. The TWA 10 includes two input terminals, TinP and TinN, a number of input transmission lines, Lin1P to Lin4P and Lin1N to Lin4N, a number of amplifier units, 12a to 12d, a number of output transmission lines, Lout1P to Lout4P and Lout1N to Lout4N, two output terminals, ToutP and ToutN, and terminators, R1 to R4. In the description and the drawings, a character "P" added in rearmost of respective elements means that the elements correspond to the positive phase signals, while, a character "N" also added in rearmost means that the elements correspond to the negative phase signals. The embodiments shown in figures provide four amplifier units, but a TWA of the present application does not restrict a case where the number of the amplifier units is four. The TWA may provide two or more amplifier units. Depending on the number of the amplifier units, the number of input transmission lines and that of the output transmission lines may be optionally varied.

The input terminals, TinP and TinN, receive input signals of the type of the differential signal containing high frequency components exceeding 40 GHz, sometimes reaching 50 GHz. The input terminal TinP is connected to the non-inverting inputs INnP, n=1 to 4, of the amplifier units, 12a to 12d, through the input transmission lines, Lin1P to Lin3P. The other input terminal TinN is connected to inverting inputs INnN, n=1 to 4, of the amplifier units, 12a to 12d, through the other input transmission lines, Lin1N to Lin3N. The input transmission lines, Lin1P to Lin4P and Lin1N to Lin4N, which are connected in series with respect to the input terminals, TinP and TinN, respectively, may be co-planar lines but not restricted to the co-planar line. Other configuration may be applicable as long as at least a transmission delay thereof may be defined. The arrangement of a micro-strip line may be applicable to the input transmission lines, Lin1P to Lin4P and Lin1N to Lin4N. The description below and the drawings sometimes denote those input transmission lines collectively as an input transmission line LinP and another input transmission line LinN.

The first positive input transmission line Lin1P is put between the non-inverting inputs, IN1P and IN2P, of the amplifier units, 12a and 12b. The second positive input transmission line Lin2P is provided between the non-inverting inputs, IN2P and IN3P, of the amplifier units, 12b and 12c; the third positive input transmission line Lin3P is put between the non-inverting inputs, IN3P and IN4P, of the amplifier units, 12c and 12d; the fourth input transmission line Lin4P is provided between the non-inverting input IN4P of the fourth amplifier unit 12d and the terminator R3. An arrangement of the negative input transmission lines, Lin1N to Lin4N, is similar to those of the positive input transmission lines, Lin1P to Lin4P, described above. That is, the first to third negative input transmission lines, Lin1N to Lin3N, are put between the inverting inputs, IN1N to IN3N, of the amplifier units, 12a to 12c, and the fourth negative input transmission line Lin4N is provided between the inverting input IN4N of the fourth amplifier unit 12d and the other terminator R4.

The TWA 10 shown in FIG. 1 may further include additional input transmission lines, Lin0P and Lin0N, each provided between the input terminals, TinP and TinN, and the inputs, IN1P and IN1N, of the first amplifier unit 12a. A feature of the TWA 10 shown in FIG. 1 is that the input transmission lines, LinP and LinN, may include compensation units, CS1P to CS4P and CS1N to CS4N, between respective input transmission elements, Lin1P to Lin4P and Lin1N to Lin4N. That is, the first positive compensation unit CS1P is put between the input terminal TinP and the first input transmission line Lin1P, the second positive compensation unit CS2P is provided between the first and second input transmission lines, Lin1P and Lin2P. Similarly, the third and fourth compensation units, CS3P and CS4P, are provided between the input transmission lines, Lin2P and Lin3P, and between the third and fourth input transmission lines, Lin3P and Lin4P. The arrangements of the negative compensation units, CS1N to CS4N, are same as those of the positive compensation units, CS1P to CS4P.

The amplifier units, 12a to 12d, receive the differential input signals from the input terminals, TinP and TinN, accompanied with respective delays different from others. Details of the amplifier units, 12a to 12d, will be described later as referring to FIG. 2.

The output terminals, ToutP and ToutN, output the amplified signals of the type of the differential signal. The output terminal ToutP is connected to the non-inverting outputs, OUT1P to OUT1N, of the amplifier units, 12a to 12d, through respective positive output transmission lines, Lout2P to Lout4P, while, the other output terminal ToutN is connected to inverting outputs, OUT1N to OUT4N, of the amplifier units, 12a to 12d, through respective negative output transmission lines, Lout2N to Lout4N. The output transmission lines, Lout1P to Lout4P and Lout1N to Lout4N, which are connected in series to the output terminals, ToutP and ToutN, respectively, may also have the arrangement of the co-planar line, the micro-strip line, or any other arrangements explicitly defining the delay time thereof.

The first output transmission line Lout1P is provided between the terminator R1 and the second output transmission line Lout2P; the second output transmission line Lout2P is provided between the first output transmission line Lout1P and the third output transmission line Lout3P; the third output transmission line Lout3P is provided between the second output transmission line Lout2P and the fourth output transmission line Lout4P; and the fourth output transmission line Lout4P is provided between the third output transmission line Lout3P and the output terminal ToutP. The negative output transmission lines, Lout1N and Lout4N, have the arrangement same as those of the positive output transmission lines, Lout1P to Lout4P. The first and second terminators, R1 and R2, are provided between the first output transmission lines, Lout1P and Lout1N, and the power supply line Vcc. The first and second terminators, R1 and R2, may be terminated to the ground, in a modified arrangement.

The non-inverting and inverting outputs, OUT1P and OUT1N, of the first amplifier unit 12a is connected to the first output transmission lines, Lout1P and Lout1N, and the second output transmission lines, Lout2P and Lout2N, respectively. The second amplifier unit 12b in the non-inverting output OUT2P and the inverting output OUT2N are connected to the second output transmission lines, Lout2P and Lout2N, and the third output transmission lines, Lout3P and Lout3N; the third amplifier unit 12c in the non-inverting and inverting outputs, OUT3P and OUT3N, respectively are connected to the third output transmission lines, Lout3P and Lout3N, and the fourth output transmission lines, Lout4P and Lout4N. The fourth amplifier unit 12d in the non-inverting and inverting outputs, OUT4P and OUT4N, thereof are directly connected to the output terminals, ToutP and ToutN, respectively.

The operation of the TWA 10 will be described. The TWA 10 may receive signals complementary to each other in the input terminals, TinP and TinN. Specifically, the input terminal TinP receives a positive phase input signal, while, the other input terminal TinN receives a negative phase input signal. These two inputs signals are transferred to respective amplifier units, 12a to 12d, through the input transmission lines, LinP and LinN, accompanied with respective transmission delays that are adjustable by lengthen or shorten the lengths of respective transmission lines, LinP and LinN.

The amplifier units, 12a to 12d, amplify the input signals, and output the amplified signals on the output transmission lines, LoutP and LoutN. The amplified signals are also complementary to each other that constitute a differential signal. Because the amplifier units, 12a to 12d, receive the input signals with respective delays different from others, the output signals each output from the amplifier units, 12a to 12d, have phases different from others. In the TWA 10, the output signals of respective amplifier units, 12a to 12d, are aligned in the phases thereof at the output terminals, ToutP and ToutN. The delays for the output signals may be varied by adjusting the electrical length of the output transmission lines, LoutP and LoutN.

Explaining further specifically, the first amplifier unit 12a directly receives the input signals, which means that no input delay is counted, and outputs the output signals through the output transmission lines, Lout2P to Lout4P and Lout2N to Lout4N, which means that three unit delays are counted assuming that the output transmission lines, Lout1P to Lout4P and Lout1N to Lout4P, are attributed to a unit delay equal to the others. Accordingly, the input signals appear at the output terminals, ToutP and ToutN, after amplified by the first amplifier unit 12a accompanied with three unit delays. The second amplifier unit 12b receives the input signals through the input transmission lines, Lin1P and Lin1N, with one unit delay, and outputs the output signals at the output terminals, ToutP and ToutN, through the output transmission lines, Lout3P to Lout4P and Lout3N to Lout4N, with two unit delays. Thus, the input signals appear at the output terminals, ToutP and ToutN, as being amplified by the second amplifier 12b with three unit delays. The situation same as those for the first and second amplifiers, 12a and 12b, may be applied to the rest amplifier units, 12c and 12d.

According to the mechanism above described, the TWA 10 may amplify the input signals provided to the input terminals, TinP and TinN, with a substantial gain even when each of the amplifier units, 12a to 12d, shows a relatively small gain, and output thus amplified output signals at the output terminals, ToutP and ToutN. The description above concentrates on a case where the TWA 10, and the amplifier units, 12a to 12d, have the differential arrangement, namely, processing the positive phase signals and the negative phase signals complementary to each other. However, the TWA 10 of the present invention may have a single-ended arrangement, in which the input terminal ToutN, the input transmission lines, Lin1N to Lin4N, the output transmission lines, Lout1N to Lout4N, terminators, R2 and R4, and the output terminal ToutN, where they correspond to the negative phase signals, may be removed from the TWA 10.

Figure 2:
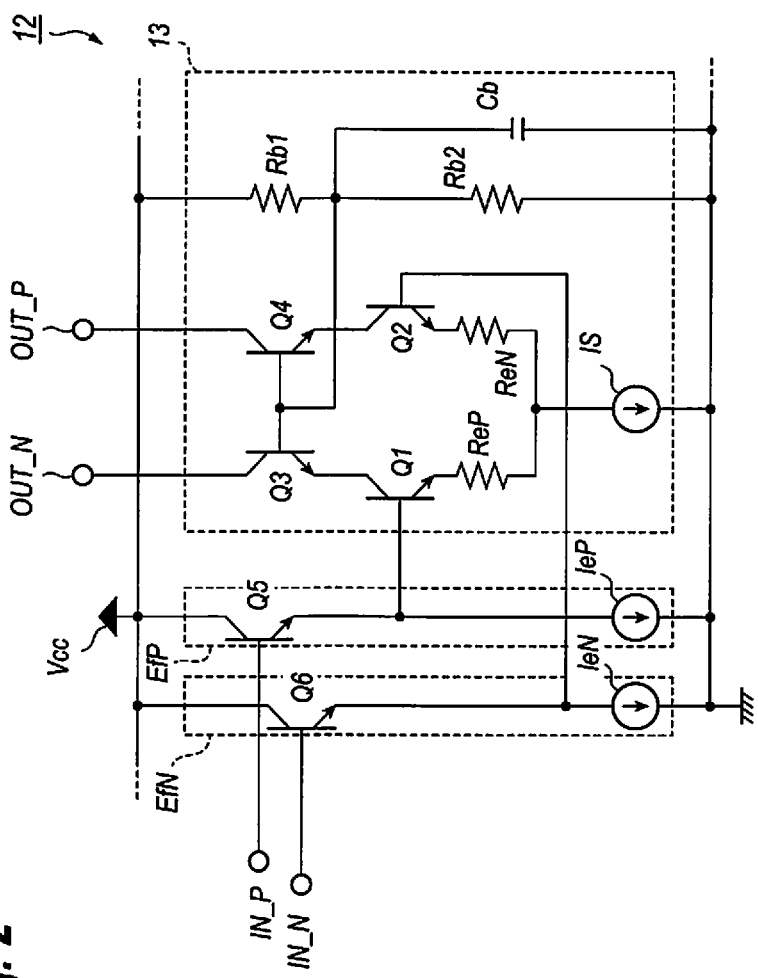
FIG. 2 shows a circuit diagram of an amplifier unit implemented in the TWA shown in FIG. 1.

Next, an arrangement of the amplifier units, 12a to 12d, will be described as referring to FIG. 2. The amplifier unit 12n, n=1 to 4, includes an amplifying section 13 accompanied with emitter followers, EfP and EfN, in the front end of the TWA 12, the non-inverting and inverting inputs, IN_P and IN_N, and the non-inverting and inverting outputs, OUT_P and OUT_N. The emitter followers, EfP and EfN, each provide transistors, Q5 and Q6, and current sources, IeP and IeN. The transistors, Q5 and Q6, in the base thereof receive the input signals from the non-inverting and inverting inputs, IN_P and IN_N, and output the input signals from the emitters thereof. The current sources, IeP and IeN, which provide the bias currents to the transistors, Q5 and Q6, may have a conventional arrangement.

The amplifying section 13, which is put in downstream the emitter followers, EfP and EfN, includes four transistors, Q1 to Q4, a current source IS, two emitter resistors, ReP and ReN, two bias resistors, Rb1 and Rb2, and a bias capacitor Cb. The amplifying section 13 may differentially amplify the outputs of the emitter followers, EfP and EfN. Specifically, two transistors, Q1 and Q2, which constitute a differential pair, receive the outputs of the emitter followers, EfP and EfN, in the bases thereof. The emitters of the transistors, Q1 and Q2, are commonly connected to the current source IS through respective emitter resistors, ReP and ReN; and the collectors of the paired transistors, Q1 and Q2, are brought to the inverting and non-inverting outputs, OUT_N and OUT_P, through the transistors, Q3 and Q4, where these transistors, Q3 and Q4, are often called as the cascode transistor, and have the base grounded configuration. The bases of the cascode transistors, Q3 and Q4, receive the bias determined by two bias resistors, Rb1 and Rb2, provided between the power supply voltage Vcc and the ground. The bias capacitor Cb may stabilize the bias supplied to the bases of the cascode transistors, Q3 and Q4.

The operation of the amplifier unit 12 shown in FIG. 2 will be described. The amplifier unit 12 differentially receives the input signals in the non-inverting and inverting inputs, IN_P and IN_N, which means that the emitter followers, EfP and EfN, receives the input signals through the input transmission lines, LinP and LinN. The emitter followers, EfP and EfN, enhances the input impedance thereof, which means that substantially no current flows into the emitter followers, EfP and EfN, and the input signals appearing in the input terminals, TinP and TinN, are not attenuated even two or more amplifier units are provided in parallel to the input terminals, TinP and TinN. The emitter followers, EfP and EfN, transfer thus received input signals to the amplifying section 13, specifically, to the bases of the paired transistors, Q1 and Q2.

The paired transistors, Q1 and Q2, differentially amplify the received input signals. The cascode transistors, Q3 and Q4, suppress the saturation of the paired transistors, Q1 and Q2. That is, the emitters of the cascode transistors, Q3 and Q4, which are equal to the collectors of the paired transistors, in the levels thereof are substantially fixed in a voltage of the base level of the cascode transistors, Q3 and Q4, subtracted by a forward junction voltage between the base and the emitter, which is around 0.8V. The base level of the cascode transistors, Q3 and Q4, is determined by the voltage divider constituted by two bias resistors, Rb1 and Rb2, in a value of Vcc*Rb2/(Rb1+Rb2). Accordingly, the collector level of the paired transistors, Q1 and Q2, become Vcc*Rb2/(Rb1+Rb2)−0.8 [V]. Only the collector current of the paired transistors, Q1 and Q2, are varied. Thus, the amplifying section 13 portions out the current of the current source IS between the two outputs, OUT_P and OUT_N, depending on the input signals, IN_P and IN_N, as keeping the collector-emitter bias substantially in constant.

Figure 3:
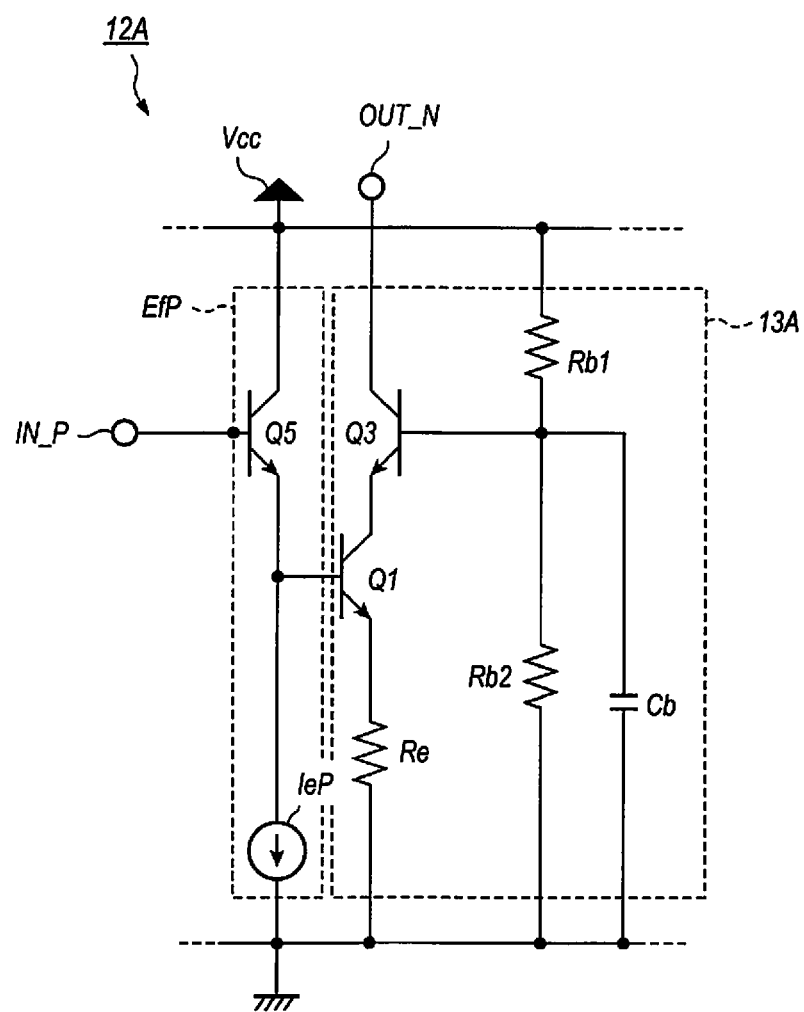
FIG. 3 shows a circuit diagram of an amplifier unit modified from the amplifier unit shown in FIG. 2.

FIG. 3 is a circuit diagram of an amplifier unit according to another embodiment. The amplifier unit 12A shown in FIG. 3 has a feature that the circuit has the single-ended arrangement. Specifically, the amplifier unit 12A includes one emitter follower EfP and an amplifying section 13A that includes two transistors, Q1 and Q3, one emitter resistor Re, two bias resistors, Rb1 and Rb2, and one bias capacitor Cb. The operation of the bias circuit, Rb1, Rb2, and Cb, is same with that explained in the aforementioned circuit shown in FIG. 2. The transistor Q1, depending on the input signal appearing in the non-inverting input IN_P, turns on and off the output current output from the inverting output OUT_N, where the output current may be determined by the emitter resistor Re. Although the circuit 12A shown in FIG. 3 receives the input signal with the positive phase and outputs the output signal of the negative phase, the circuit 12A may receive the input signal with the negative phase and outputs the positive phase signal.

Referring back to FIG. 1, one feature of the TWA 10 of the present embodiment is that the input transmission liens, LinP and LinN, provide plurality of compensating units, CS_P and CsnN, n=1 to 4. A transmission line such as the input transmission lines, LinP and LinN, in high frequency characteristic thereof is often and strongly affected by parasitic components. Even when respective transmission lines, LinP and LinN, are designed to have the unit delay by adjusting the width and length thereof depending on a base material on which the transmission lines, LinP and LinN, are formed; the parasitic components around the amplifier units, 12a to 12d, may easily shift the delay time from the designed one, which disorders the superposition of the amplified signals at the output terminals, ToutP and ToutN.

Considering the frequency characteristic of the TWA 10, the input signals provided in the input terminals, TinP and TinN, are divided into respective amplifier units, 12a to 12d, with delays different from others; then, superposed in the common phase at the output terminals, ToutP and ToutN. That is, four paths exist from the input terminals, TinP and TinN, to the output terminals, ToutP and ToutN. The frequency response of respective paths may be determined by a product of the transfer characteristic of the input transmission lines, LinP and LinN; that of the amplifier units, 12a to 12d; and that of the output transmission lines, LoutP and LoutN. Moreover, the frequency response of the TWA 10 may be denoted by a sum of the frequency response of respective paths.

For the output transmission lines, LoutP and LoutN, the frequency response thereof may be flattened by setting capacitance of the bias capacitor Cb large enough compared with the collector-base junction capacitance of the cascode transistors, Q3 and Q4, which means that the base of the cascode transistors, Q3 and Q3, are imaginarily grounded. The output impedance of the amplifier units, 12a to 12d, viewed from the non-inverting and inverting output ports, OUT_P and OUT_N, may be substantially determined only by the collector-base junction capacitance of the cascode transistors, Q3 and Q4, which is small enough in frequencies subject to the TWA 10. Accordingly, the bias capacitor Cb having the capacitance large enough may flatten the frequency response of the output transmission lines, LoutP and LoutN.

For the frequency response of the amplifier units, 12a to 12d, the amplifying section 13, which has the differential arrangement, may flatten the frequency response by implementing transistors, Q1 to Q4, having enough performance in frequencies subject to the TWA 10. For instance, a hetero-junction bipolar transistor (HBT) primarily made of indium phosphide (InP) material may suppress the gain fluctuation within 1 dB in frequencies up to several scores of giga-hertz. Another type of the amplifier unit 12A shown in FIG. 4, which has the single-ended arrangement, may show a situation similar to the condition above described.

Concerning to the input transmission lines, LinP and LinN, various factors affect the frequency response thereof, in particular, the input impedance of the amplifier units, 12a to 12d, strongly affects the frequency response of the input transmission lines, LinP and LinN.

Figure 4:
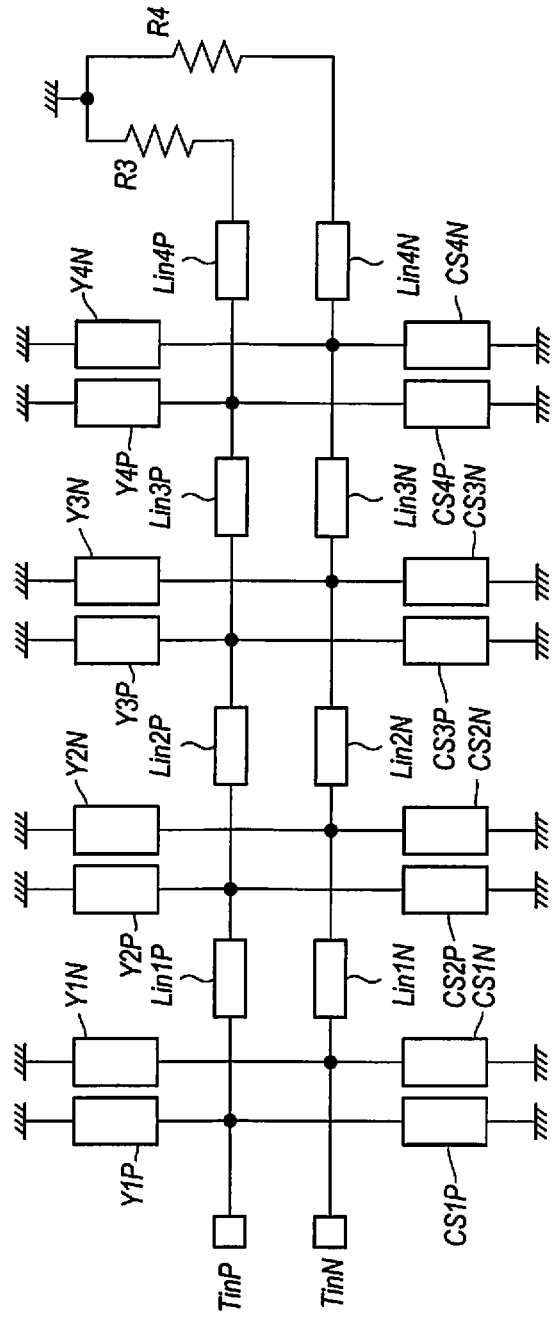
FIG. 4 shows an equivalent circuit of the input transmission lines implementing the amplifier units and the compensation units.

FIG. 4 shows an equivalent circuit around the input transmission lines, LinP and LinN, where admittance elements, YnP and YnN, n=1 to 4, correspond to the admittance viewed from the non-inverting and inverting inputs, IN_P and IN_N, of the amplifier units, 12a to 12d. A case, where no compensating elements, CS_P and CS_N, are provided, is first considered. Assuming Zline is impedance of respective input transmission lines, Lin1P to Lin4P and Lin1N to Lin4N, the impedance Zline is given by:

$$Zline = \sqrt{(Lline/(Cline + Cin))},\qquad(1)$$

where Lline and Cline are inductance and capacitance attributed to the transmission line, and Cin is input capacitance of the amplifier units, 12a to 12d. When the TWA 10 is formed on a substrate made of InP and directed to be operable in several scores of giga-hertz, the inductance Lline and capacitance Cline of the transmission line may be assumed to be around 80 pH and about 10 fF, respectively. Denoting the delay time caused by respective transmission lines, Lin1P to Lin4P and Lin1N to Lin4N, as Dline, the delay time Dline is given by:

$$Dline = \sqrt{(Lline \times (Cline + Cin))}.\qquad(2)$$

Figure 5:
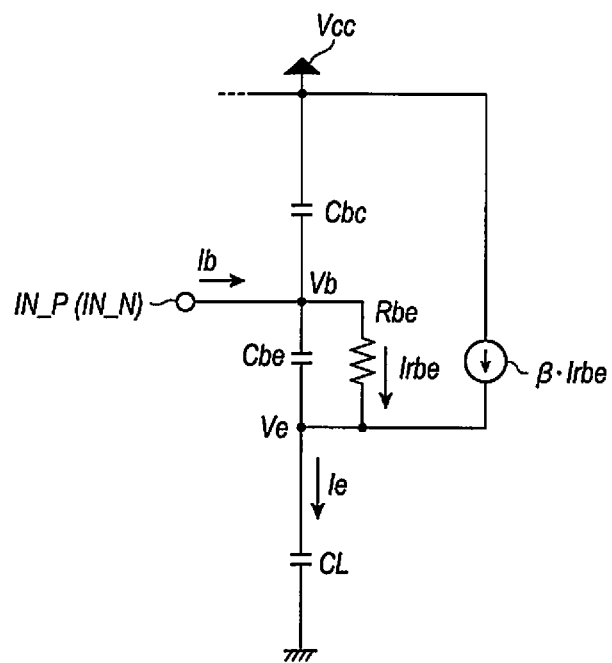
FIG. 5 shows an equivalent circuit of the amplifier unit.

Furthermore, FIG. 5 shows an equivalent circuit diagram of the amplifier units 12, where Rbe, Cbc, and Cbe correspond to the base-emitter resistance, the base-collector capacitance, and the base-emitter capacitance of the transistor Q5, respectively; Irbe, Ib, and Ie are currents flowing in the base-emitter resistor Rbe, the base current and the emitter current; β is a current gain; and CL collectively denotes the input capacitance of the amplifying section 13 viewed from the emitter of the transistor Q5. Based on the equivalent circuit shown in FIG. 5, the admittance Yn of the amplifier unit 12 is given by:

$$Y = \left(\frac{1}{R_b} + s(C_{bC} + C_{be})\right) - \frac{\left(\frac{1}{R_b} + sC_{be}\right)\left(\frac{\beta'}{R_b} + s(C_{ge} + C_L)\right)}{\left(\frac{\beta'}{R_b} + sC_{be}\right)}\qquad(3)$$

where $\beta' = \beta + 1$ and $s = j\omega$; j is a complex unit ($j^2 = -1$) and $\omega$ is an angular frequency ($\omega = 2\pi f$). Re-arranging equation (3) above and extracting terms relating to the imaginary part, namely, beginning with s, which is listed below, the term corresponds to the input capacitance Cin in equations (1) and (2).

$$sC_{in} = s\left(C_{bc} + C_{be} + \frac{C_L\frac{\beta'}{R_b^2} - C_{be}\omega^2 C_{be}(C_{be} + C_L) - C_{be}\left(\frac{\beta'}{R_b}\right)^2}{\omega^2(C_{be} + C_L)^2 + \left(\frac{\beta'}{R_b}\right)^2}\right)\qquad(4)$$

As shown in equation (4), the input capacitance Cin shows frequency dependence, that is, the input capacitance Cin becomes $C_{bc} + C_L/\beta'$ at relatively low frequencies ($\omega \sim 0$), while, Cin becomes $C_{bc} + C_L \cdot C_{be}/(C_L + C_{be})$ at high frequencies ($\omega \sim \infty$). Comparing the capacitance $C_L/\beta'$ with the series capacitance $C_L \cdot C_{be}/(C_L + C_{be})$, the latter generally becomes larger. Thus, because the input capacitance $C_{in}$ of the amplifier units, 12a to 12d, show frequency dependence, the delay time Dline of the input transmission lines, LinP and LinN, given by equation (2) above resultantly show the frequency dependence. The compensations units, CS_P and CS_N, may effectively compensate this frequency dependence of the input capacitance $C_{in}$ of the amplifier units, 12a to 12d.

Figure 6:
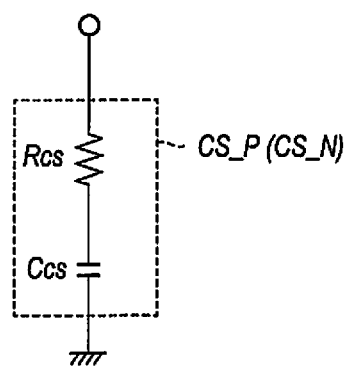
FIG. 6 shows an example of the compensation unit.

FIG. 6 shows an example of the compensation units, CS_P and Cs_N, where the compensation units, CS_P and CS_N, has a series circuit of a resistor Rcs and a capacitor Ccs. The admittance of the compensation unit, CS_P and CS_N is given by:

$$Y_{cs} = \frac{(\omega C_{cs})^2 R_{Cs} + j\omega C_{cs}}{1 + (\omega C_{cs} R_{cs})^2}\qquad(5)$$

In equation (5) above, the capacitive component may be denoted as $Ccs/((1+(\omega Ccs \cdot Rcs)^2)$, which is substantially inverse proportional to frequencies. In the equivalent circuit of the input transmission lines, LinP and LinN, shown in FIG. 4, the compensations units, CSnP and CSnN, are connected in parallel to the input admittance, YnP and YnN, of the amplifier units, 12a to 12d. That is, the capacitive components viewed from respective input transmission lines, LinP and LinN, increases in low frequencies by the compensation units, CSnP and CSnN, while, that in high frequencies are inherently increased by the input capacitance of the amplifier units, 12a to 12d. Thus, the delay time caused by respective input transmission lines, LinP and LinN, may be effectively compensated.

Figure 7A:
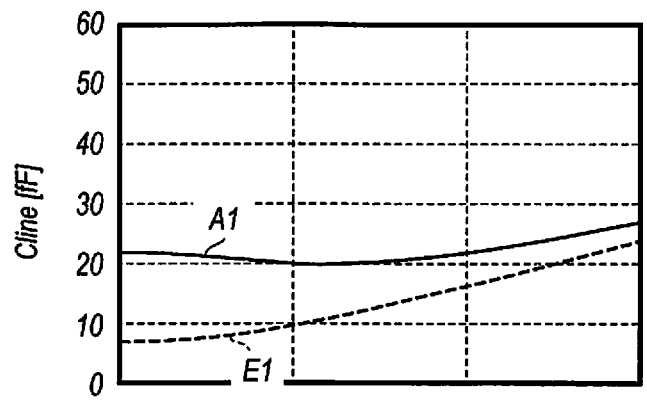
FIGS. 7A to 7C compare frequency dependence of the input capacitance Cin, the line impedance of the input transmission line Zline, and the delay time attributed to the input transmission line between the existence and the non-existence of the compensation unit.
Figure 7B:
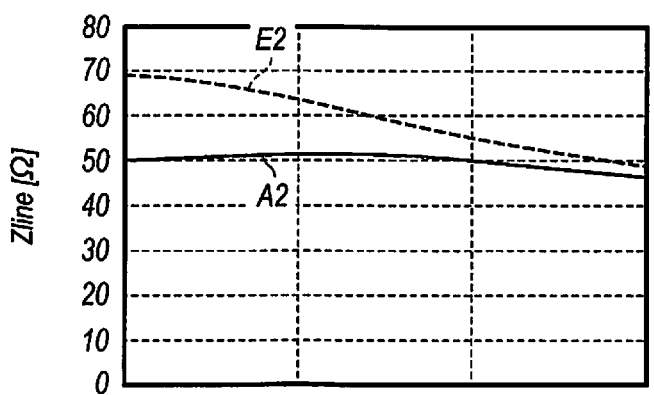
Figure 7C:
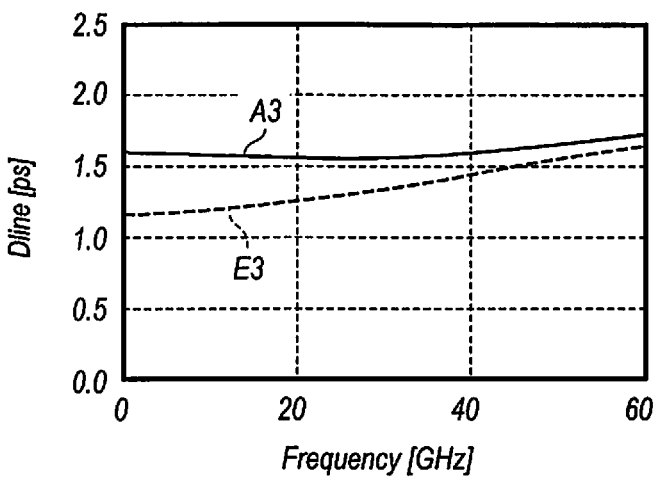

FIGS. 7A to 7C compare behaviors of the capacitive components Cline viewed from the input transmission lines, LinP and LinN, with and without compensation units, CSnP and CSnN; those of impedance Zline of the input transmission lines; and those of the delay time Dline. Behaviors E1 to E3 correspond to cases without compensation units, CS_P and CS_N, while, behaviors A1 to A3 show the results implementing the compensation units, CS_P and CS_N. In FIGS. 7A to 7C, parameters in the compensation units, CS_P and CS_N, are Ccs=15 fF and Rcs=350Ω, and those in the amplifier units, 12a to 12d, are set to be CL=100 fF, Rb=500Ω, Cbe=100 fF, Cbc=5 fF, and β=49.

Referring to FIG. 7A, the capacitive component Cline, which is the input capacitance Cin, of the amplifier units, 12a to 12d, increases by almost three times (about 7 fF to about 20 fF) E1 in the case of no compensation units, CS_P and CS_N, but, by implementing the compensation units, the capacitance Cline may be suppressed to only 30% increase (from 20 fF to 25 fF) A1 because of the enhancement in low frequencies by the compensation units, CS_P and CS_N. The impedance Zline of the input transmission lines, LinP and LinN, may be also suppressed in the variation thereof. For the case of no compensation units, the impedance Zline in high frequencies decreases from 690 to 420, E2; but the decrease may be suppressed from 520 to 410 in the case with compensation units, shown by A2. Also, the delay time Dline may be flattened by the existence of the compensation units indicated by A3 compared with the case without compensation units indicated by E3. Thus, the compensation units, CS_P and CS_N, added to respective input transmission lines, LinP and LinN, may suppress the dispersion of the delay time of the input transmission lines, LinP and LinN. The verification above assumes that the capacitance and the resistance of the compensation units, CS_P and CS_N, are 350 and 15 fF, respectively. However, these parameters are not restricted to those. Depending on the transistors implemented within the amplifier units, 12a to 12d, the resistance and the capacitance may be varied in 100 to 800Ω and 5 to 30 fF, respectively.

Figure 8:
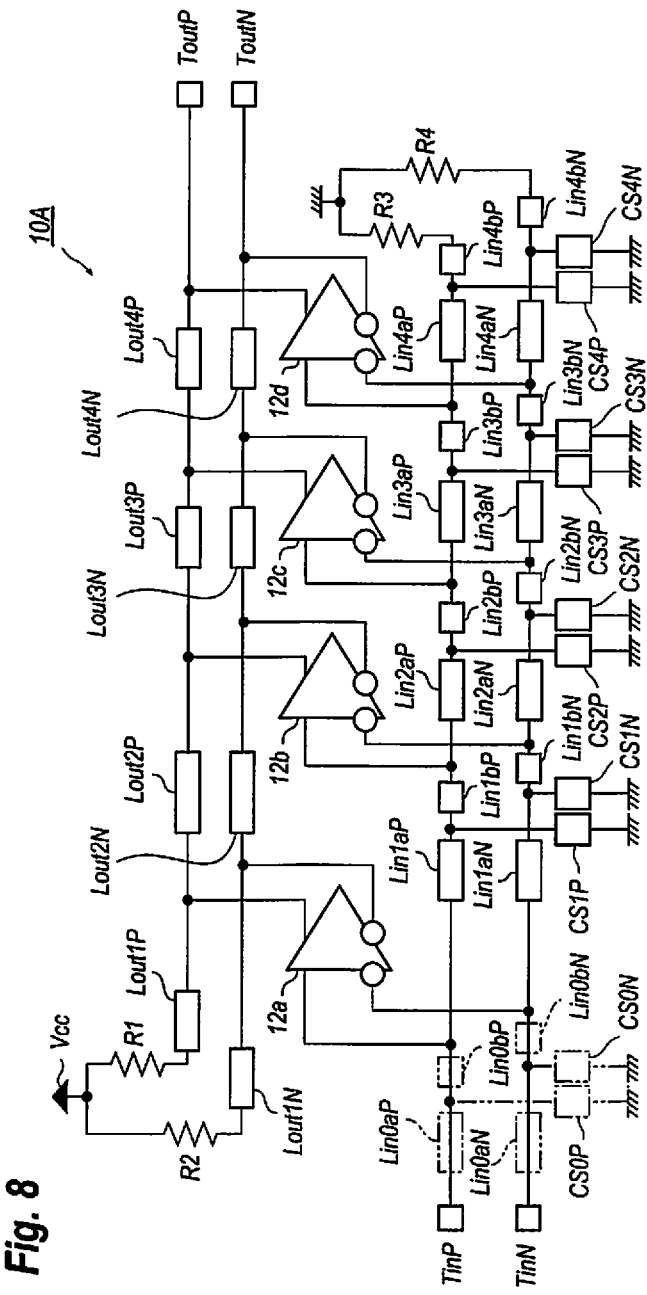
FIG. 8 is a circuit diagram of another TWA according to a second embodiment of the present invention.

In the aforementioned embodiment, the compensation units, CS_P and CS_N, are connected in parallel to the amplifier units, 12a to 12d, to compensate the input capacitance of the amplifier units, 12a to 12d. However, the compensation units, CS_P and CS_N, are optionally put within the input transmission lines, LinP and LinN. FIG. 8 shows a circuit diagram of a TWA 10A modified from the TWA 10 shown in FIG. 1. The TWA 10A shown in FIG. 8 divides respective input transmission lines, Lin1P to Lin4P and Lin1N to Lin4N, into two parts. For instance, the first positive input transmission line Lin1P is divided into two parts of a front part and a rear part, Lin1aP and Lin1bP, respectively, and the compensation unit CS1P is connected between these divided transmission lines, Lin1aP and Lin1bP. Other input transmission lines, Lin2P to Lin4P and Lin1N to Lin4N, are similarly modified. Even when the compensation units, CS_P and CS_N, are thus put within respective transmission lines, the TWA 10A, the input transmission lines, LinP and LinN, may show flattened frequency response.

Figure 9:
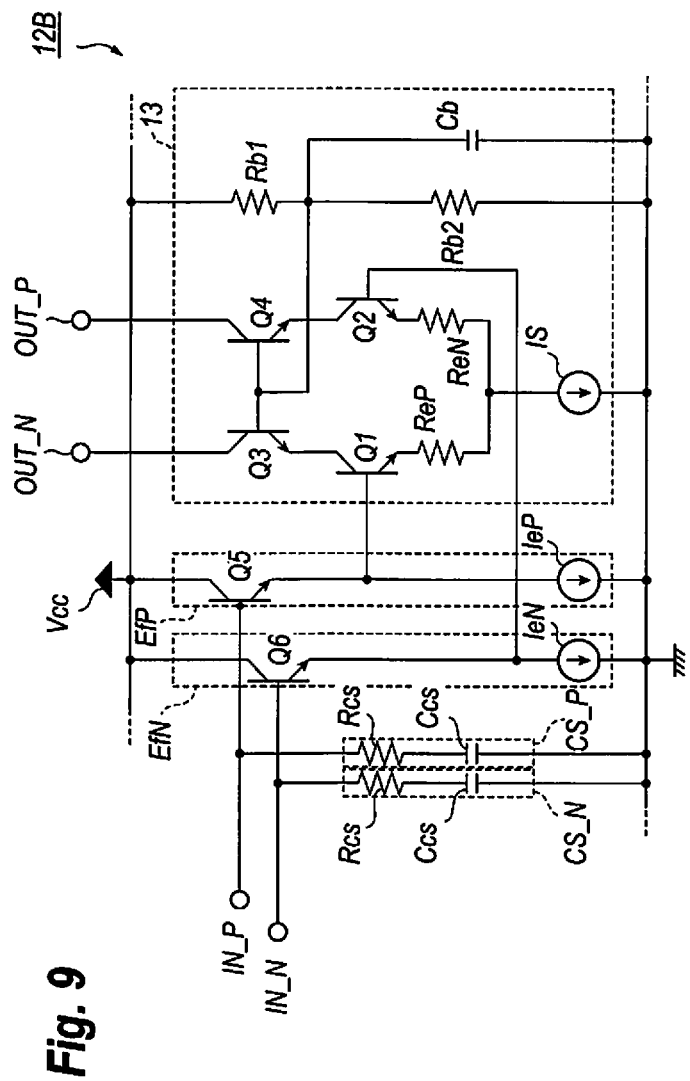
FIG. 9 shows a circuit diagram of the amplifier unit according to the third embodiment of the present invention.

FIG. 9 shows a circuit diagram of still another modification of the amplifier unit 12B. The amplifier unit 12B shown in FIG. 9 has a feature that the compensation units, CS_P and CS_N, are integrally provided within the amplifier unit 12B. Other arrangements of the amplifier unit 12B are same with those of the aforementioned amplifier unit 12 shown in FIG. 2, and will be omitted in the description thereof. The input ports, IN_P and IN_N, receive the input signals through the input transmission lines, LinP and LinN. The input ports, IN_P and IN_N, are connected not only to the bases of the transistors, Q5 and Q6, in the emitter followers, EfP and EfN, but to the compensation units, CS_P and CS_N, where the compensation units, CS_P and CS_N, each includes the resistor Rcs and the capacitor Ccs as those shown in FIG. 6. A TWA having the input transmission lines, LinP and LinN, and the amplifier units 12B each having the arrangement shown in FIG. 9 may flatten the frequency response thereof because the input capacitance of the emitter followers, EfP and EfN, and the amplifying section 13 in the amplifier units 12, may be compensated by the compensation units, CS_P and CS_N, set in the front end of the amplifier units 12B.

Figure 10:
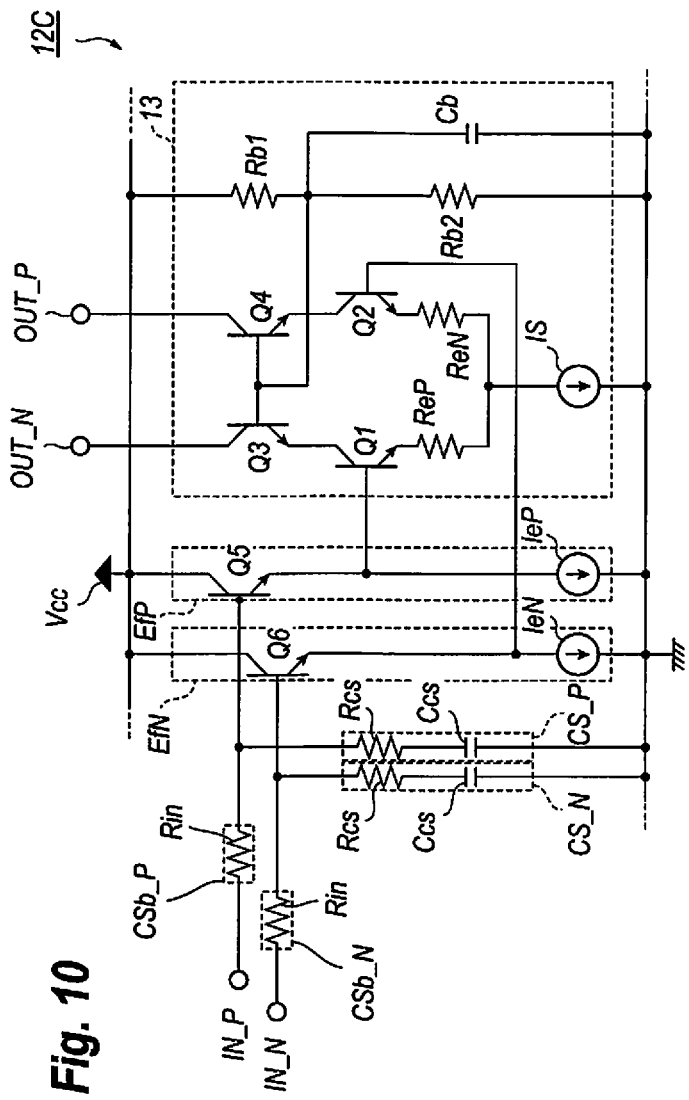
FIG. 10 shows a circuit diagram of the amplifier unit according to the fourth embodiment of the present invention.

FIG. 10 shows a circuit diagram of still another modification of the amplifier unit, which may enhance the trans-conductance thereof. When the number of the amplifier units connected in parallel to the input terminals, TinP and TinN, increases, the trans-conductance, Iout/Vin, where Iout is an output current, output from the amplifier unit and Vin is the input signal, generally degrades in high frequencies even when the amplifier unit, or the input transmission line, provides the compensation unit. This is because the compensation unit compensate the response in low frequencies by adding the compensating capacitor Ccs in parallel to the input capacitance Cin. However, the response in high frequencies is primarily determined by the high frequency performance of the amplifier unit itself. As exemplarily shown in FIG. 7A; the performance of the amplifier unit in high frequencies, typically higher than several scores of giga-hertz, inherently degrades because of the increase of the input capacitance.

The amplifier unit 12C shown in FIG. 10, which may compensate the degradation in high frequencies, includes, in addition to the intrinsic amplifier unit 12 accompanied with the compensation units, CS_P and CS_N, input compensators, CSb_P and CSb_N, each constituted by a resistor Rin. The former resistor is put between the input port IN_P and the emitter follower EfP, while, the latter is connected between the other input port IN_N and the other emitter follower EfN, which means that the former resistor is provided between the input terminal TinP through the input transmission line LinP and the compensation unit CS_P, while the latter resistor RbN is provided between the other input terminal TinN through the negative input transmission line LinN and the compensation unit CS_N for the negative phase. Although FIG. 10 explicitly shows the resistors Rin as the input compensator, CSb_P and CSb_N, the input compensator, CSb_P and CSb_N, may include other circuit elements, such as inductors and/or capacitors, as long as the impedance of the input compensators, CSb_P and CSb_N, may be primarily determined by the resistors Rin, in frequencies subject to the TWA 10, namely, 0 to 50 GHz.

Next, advantages of the TWA 10 implementing the amplifier units, 12a to 12d, each having the input compensators, CSb_P and CSb_N, will be described as referring to FIG. 11, which schematically illustrates a relation between the input signal and the output signal of a TWA, where the horizontal axis corresponds to the input signal Vin, while, the vertical axis corresponds to the output signal Vout. Behaviors, E6, E7@f1, and E7@f2, are transfer curves of the TWA under consideration, where E6 is the transfer curve of a TWA applicable only to the two-level modulation, that is, the TWA showing the behavior E6 makes a transition only between the "H" level and the "L" level.

The transfer curve E7, which are presented as a comparable example, corresponds to a TWA applicable to a multi-level modulation such as PAM-4. That is, the input signal Vin may take the lowest level Vin1, the highest level Vin2, and other two levels, Vm1 and Vm2, between the lowest and highest levels, Vin1 and Vin2. Accordingly, the TWA attributed to the transfer curve E7 shows linearity between the input Vin and the Vout in a widened region. However, the TWA without input compensators shows frequency dispersion in the transfer curve thereof. That is, the transfer curve becomes the behavior E7@f1 at a frequency f1, and that E7@f2 at a frequency f2.

Figure 11:
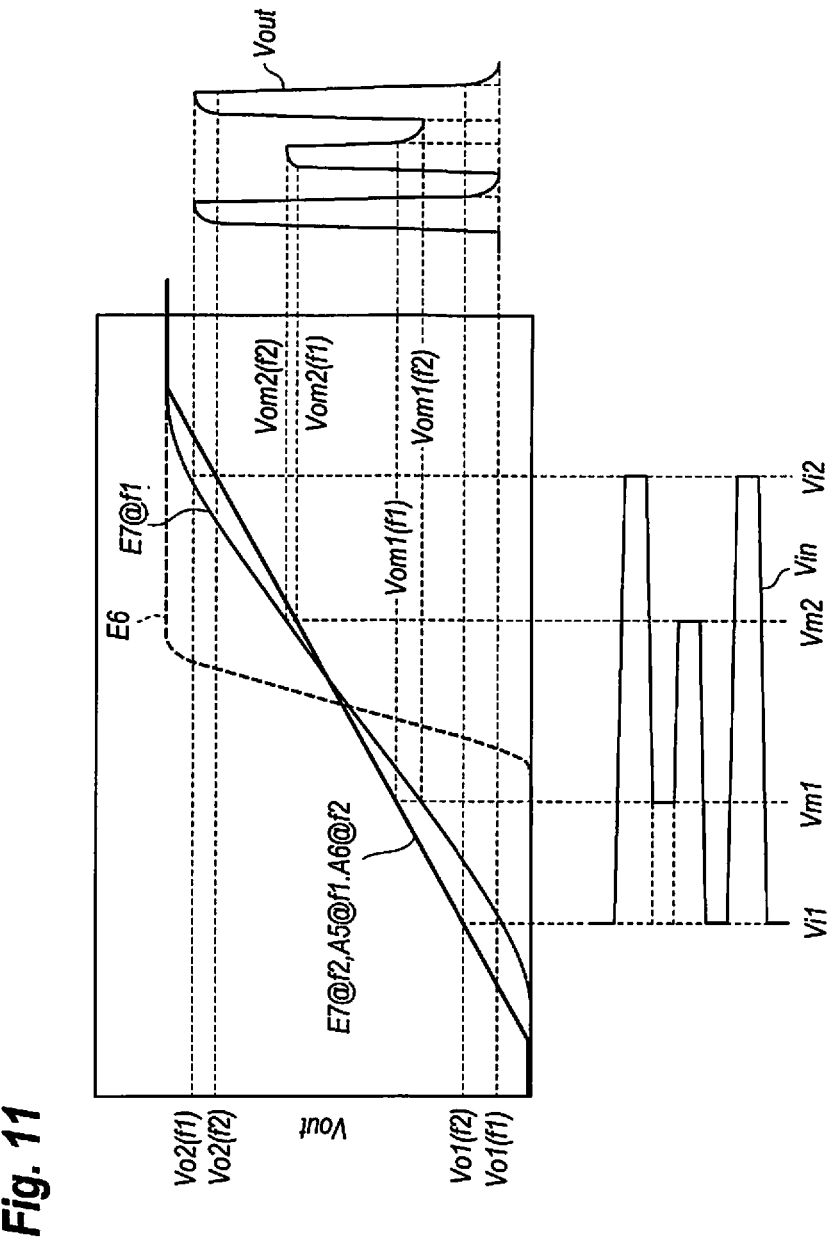
FIG. 11 schematically shows advantageous of the TWA of the present invention with a flattened frequency response when the TWA is applied for the multi-level modulation signal.

When the TWA implements the input compensator, the transfer curve E6@f1 at a frequency f1 substantially coincides with the transfer curve E6@f2 at a frequency f2, which coincide with the transfer curve E7@f2 of the comparable TWA in FIG. 11.

When the input signal Vin swings as the behavior Vin indicated in FIG. 11, the output signal Vout becomes those as shown in FIG. 11. That is, because the input signal Vin, which is a pulsed signal, contains a plurality of frequency components, each of which are amplified based on respective transfer curves and superposed as the output signal Vout. Specifically, a frequency component corresponding to the frequency f1 in the input signal Vin is amplified by the transfer curve E7@f1, that is, Vin1, Vm1, Vm2, and Vin2 become Vin1 (f1), Vm1 (f1), Vm(f1), and Vin2 (f1), respectively. While, another frequency component corresponding to the frequency f2 is amplified based on the transfer curve E7@f2, that is, Vin1, Vm1, Vm2, and Vin2 become Vin1 (f2), Vm1 (f2), Vm2 (f2), and Vin2 (f2), respectively. Accordingly, the output signal becomes that shown in FIG. 11. The output signal Vout shows dull rising edges and dull falling edges, and widened respective logic levels. Because FIG. 11 only takes two frequencies into account, respective levels in the output signal Vout show gradually increases. However, when whole frequency components subject to the TWA are considered; respective output levels become wider. On the other hand, when the TWA has a flattened frequency response by implementing the input compensator, the transfer curve at the frequency f1, namely A6@f1, coincides with the transfer curve at the frequency f2, A6@f2, where these transfer curves coincide with the transfer curve E7@f2 in FIG. 11. Under such a situation, the output signal Vout shows flattened and stable output levels.

Thus, the TWA according to the embodiments thus described having flattened frequency response may suppress the deformation appearing in the output signal thereof even when the TWA is used in the multi-level modulation. The TWA of the embodiments may be effectively implemented within the optical module processing the multi-level configuration as a modulation driver.

Although the present invention has been fully described in conjunction with the preferred embodiment thereof with reference to the accompanying drawings, it is to be understood that various changes and modifications may be apparent to those skilled in the art. For instance, the compensation units, CS_P and CS_N, and/or the input compensators, CSb_P and CSb_N, may substitute resistors, Rcs or Rin to equivalent resistance formed by diodes and/or transistors. Also, the capacitors Ccs in the compensation units, CS_P and CS_N, may be replaced by a junction capacitor of a diode and/or a transistor.

The emitter followers, EfP and EfN, have the single-stage arrangement in the embodiment described above. However, the emitter followers, EfP and EfN, may have a multi-stage configuration. Also, the amplifying section, 13 and 13A, may have the multi-stage arrangement.

The first and embodiments provide the compensation units, CS_P and CS_N, in the input transmission lines, LinP and LinN, while, the third embodiment integrates the compensation units, CS_P and CS_N, with the amplifier units, 12a to 12d. However, an arrangement may be applicable where some of compensation units are set within the input transmission lines, LinP and LinN, and rest of the compensation units are integrated within the amplifier units.

Moreover, the TWA, 10 to 10B, may further provide a pre-amplifier or a buffer amplifier between the input terminals, TinP and TinN, and the first amplifier units 12a. Also, transistors, Q1 to Q6, implemented in the amplifier units, 12a to 12d, may be a type of hetero-bipolar transistor made of indium phosphide (InP) and/or semiconductor materials in a group of InP. All such changes and modifications are to be understood as included within the scope of the present invention as defined by the appended claims, unless they depart therefrom.

I claim:

1. A travelling wave amplifier (TWA), comprising:
an input terminal configured to externally receive an input signal;
an output terminal configured to externally output an output signal;
a number of input transmission lines connected in series to each other with an end connected to the input terminal, the input transmission lines being configured to transmit the input signal from the input terminal;
a number of amplifier units including respective emitter followers, amplifier sections, input compensators and input ports, the emitter followers receiving the input signal through the input transmission lines, the amplifier sections outputting amplified signals;
a number of output transmission lines connected in series to each other with an end connected to the output terminal, the output transmission lines being configured to transmit the amplified signals output from the respective amplifier units, the output signal being a sum of the amplified signals; and
a number of compensation units provided in the respective input transmission lines, the compensation units being connected in parallel to the amplifier units and integrated within the amplifier units, the compensation units compensating for frequency responses of the emitter followers to which the compensation units are connected,
wherein the input compensators in the amplifier units are put between the compensation units and the input ports, and
wherein the input compensators include resistors connected in series to the compensation units, the emitter followers receiving the input signal divided by the respective resistors in the input compensators and the compensation units.

2. The TWA of claim 1,
wherein the input transmission lines are divided into respective front parts and rear parts connected in series to the respective front parts, and
wherein the compensation units are provided between the respective front parts and the rear parts.

3. The TWA of claim 1,
wherein the compensation units include series circuits each containing a resistor and a capacitor connected in series to the resistor.

4. The TWA of claim 1,
wherein the TWA is provided on a base made of at least one of indium phosphide (InP) and semiconductor material grouped within the InP.

5. The TWA of claim 4,
wherein the emitter followers and the amplifier sections in the amplifier units include transistors type of a hetero-bipolar transistor (HBT) primarily made of InP.

6. The TWA of claim 1,
wherein the input transmission lines and the output transmission lines are configured to be a type of one of a co-planar line and a micro-strip line.

7. The TWA of claim 1,
further including a pre-amplifier provided between the input terminal and the input transmission lines connected in series to each other.

8. The TWA of claim 1,
wherein the input transmission lines connected in series to each other provide a terminator in another end opposite to the end to which the input terminal is connected, and
wherein the output transmission lines connected in series to each other provide another terminator in another end opposite to the end to which the output terminal is connected.

9. A traveling wave amplifier (TWA) comprising:
an input terminal configured to externally receive an input signal, the input signal being a type of a differential signal including a positive phase input signal and a negative phase input signal, the input terminal including a positive phase input terminal and a negative phase input terminal, the positive phase input terminal receiving the positive phase input signal and the negative phase input terminal receiving the negative phase input signal,
a number of input transmission lines including positive phase input transmission lines and negative phase input transmission lines, the positive phase input transmission lines being connected in series with an end connected to the positive phase input terminal, the positive phase input transmission lines transmitting the positive phase input signal, the negative phase input transmission lines being connected in series with an end connected to the negative phase input terminal, the negative phase input transmission lines transmitting the negative phase input signal,
a number of amplifier units each including an emitter follower and an amplifier section, wherein the emitter follower in respective amplifier units includes a positive phase emitter follower that receives the positive phase input signal through the positive phase input transmission lines and a negative phase emitter follower that receives the negative phase input signal through the negative phase input transmission lines, wherein the amplifying section includes a differential amplifier having a positive phase output port and a negative phase output port, the differential amplifier being configured to receive an output of the positive phase emitter follower and an output of the negative phase emitter follower differentially and generate a positive phase amplified signal in the positive phase output port thereof and the negative phase amplified signal in a negative phase output port thereof;
an output terminal including a positive phase output terminal that externally outputs a positive phase output signal and a negative phase output terminal that externally outputs a negative phase output signal,
a number of output transmission lines includes positive phase output transmission lines and negative phase output transmission lines, the positive phase output transmission lines transmitting the respective positive phase amplified signals output from the amplifier units, the negative phase output transmission lines transmitting the respective negative phase amplified signals output from the amplifier units, the positive phase transmission lines being connected in series with an end connected to the positive phase output terminal, the negative phase transmission lines being connected in series with an end connected to the negative phase output terminal; and
a number of compensation units including positive phase compensation units provided in the positive phase input transmission lines and a negative phase compensation unit provided in the negative phase input transmission lines, the compensation units compensating for frequency responses of the emitter followers to which the compensation units are connected.

* * * * *